US006221680B1

(12) United States Patent
Hakey et al.

(10) Patent No.: US 6,221,680 B1
(45) Date of Patent: Apr. 24, 2001

(54) PATTERNED RECESS FORMATION USING ACID DIFFUSION

(75) Inventors: Mark C. Hakey; Steven J. Holmes, both of Milton; David Horak; Toshiharu Furukawa, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/127,132

(22) Filed: Jul. 31, 1998

(51) Int. Cl.[7] ............................................. H01L 21/00
(52) U.S. Cl. ................................................ 438/8; 438/704
(58) Field of Search ............................... 438/238, 392, 438/435, 8, 689, 695, 700, 704; 430/314, 302

(56) References Cited

U.S. PATENT DOCUMENTS

| 4,756,793 | 7/1988 | Peek . |
| 4,906,590 | 3/1990 | Kanetaki et al. . |
| 4,994,409 | 2/1991 | Yoon et al. . |
| 5,096,849 | 3/1992 | Beilstein, Jr. et al. . |
| 5,275,695 | * 1/1994 | Chang et al. ..................... 156/661.1 |
| 5,415,969 | 5/1995 | Waterman . |
| 5,494,703 | * 2/1996 | Evangelou .......................... 427/212 |
| 5,580,702 | 12/1996 | Hayase et al. . |
| 5,609,993 | 3/1997 | Hase et al. . |
| 5,618,751 | 4/1997 | Golden et al. . |
| 5,625,020 | 4/1997 | Breyta et al. . |
| 5,972,570 | * 10/1999 | Bruce et al. ....................... 430/314 |

FOREIGN PATENT DOCUMENTS

| 0291670 | * 11/1988 | (EP) ............................... G03F/7/26 |

* cited by examiner

*Primary Examiner*—Matthew Smith
*Assistant Examiner*—Calvin Lee
(74) *Attorney, Agent, or Firm*—Scully, Scott, Murphy & Presser; William D. Sabo, Esq.

(57) ABSTRACT

The present invention relates to a method for providing patterned recess formation in a previously recessed area of a semiconductor structure, i.e. DRAM trench capacitor, using acid diffusion to selectively activate some, but not all of the acid sensitive material that is filled within the recessed areas of such structures. By employing the method of the present invention, it is possible to recess all the previously recessed areas at the same time providing the same level of recessed acid sensitive material within the previous recessed areas, recess some of the previously recessed areas to a desired level leaving other portions of the structure unrecessed, or recessing the previously recessed areas to contain different levels of the acid sensitive material.

21 Claims, 2 Drawing Sheets

PATTERNED RECESS FORMATION USING ACID DIFFUSION

DESCRIPTION

1. Field of the Invention

The present invention relates to a method of fabricating a patterned semiconductor structure and, more particularly, to a method of recessing filled material within a previously recessed area of a semiconductor structure, e.g. a trench of a dynamic access memory (DRAM) chip, so as to leave a predetermined amount of said filled material within the previously recessed area. The method of the present invention which utilizes an acid diffusion step to recess the material within the previously recessed area is capable of providing a structure which is recessed equally everywhere, recessed in some areas only or recessed to different depths on different parts of the structure.

2. Background of the Invention

Generally, a semiconductor memory device such as a dynamic random access memory (DRAM) chip comprises a plurality of memory cells which are used to store a large quantity of information. Each memory cell includes a capacitor for storing electric charge and a field effect transistor for opening and closing charge and discharge passages of the capacitor. The number of bits on DRAM chips has been increasing by approximately 4× every three years; this has been achieved by reducing the cell size. Unfortunately, the smaller cell size also results in less area to fabricate the capacitor.

As the semiconductor industry moves to smaller and smaller geometries and densities, there is a greater need to switch to vertical structures. This is especially apparent in DRAM development. The trench storage was first introduced with the 4 Mb generation. Since then more and more work has been carried out inside the trench of DRAM cells. A key processing step in trench development is referred to in the art as "recessing". In recessing, a dry or wet chemical etch processis employed to remove material from inside the trench to a predetermined amount.

A major limitation of prior art recessing processes is that they non-selectively remove the material inside of all of the trenches at once. Thus, it is quite hard to provide DRAM chips that contain trenches recessed to different levels or DRAM chips that are recessed in one portion of the wafer while other parts are left unrecessed. Moreover, the prior art recessing processes are normally very sensitive to chemical loading and aspect ratios; therefore recessing of all the trenches are done unmasked at the same time, and uniformity is usually poor.

In view of the drawbacks mentioned with prior art recessing processes, there is a continued need to develop a new recessing process which is highly efficient and uniform, yet is able to selectively remove material within some of the trenches while leaving material in other trenches unrecessed. Such a method would make it possible to fabricate DRAM chips containing trenches that are recessed in some areas of the chip whereas other trenches in the chip are left unrecessed. Additionally, there is a need to develop a method which is capable of recessing all of the trenches within a DRAM chip to different depths.

SUMMARY OF THE INVENTION

An object of the present invention is to provide a recess etch process which is independent of prior art etch loading problems.

A further object of the present invention is to provide a process for selectively recessing material within a previously recessed area of a semiconductor structure, e.g. a trench of a DRAM chip, so as to leave material remaining, i.e. unrecessed, in one portion of the semiconductor structure while recessing material in other portions of the semiconductor structure.

Another object of the present invention is to provide a process for selectively recessing material within a previously recessed area of a semiconductor structure, e.g. a trench of a DRAM chip, so that said semiconductor structure, i.e. DRAM chip, contains recessed areas, i.e. trenches, that have various recessed depths.

Both of the above processes are accomplished with a high degree of uniformity.

These and other aspects can be achieved in the present invention by using a processing step that includes the diffusion of an acid source through the structure such that said acid source is capable of recessing the material used to fill the recessed areas, i.e. trenches, in one portion of the semiconductor structure while leaving other recessed areas within the structure unrecessed. Specifically, the method of the present invention comprises the steps of:

(a) filling a recessed area of a semiconductor structure containing a conformal layer therein with an acid sensitive material;
(b) subjecting the structure of step (a) to an acid source which is capable of selectively activating the acid sensitive material; and
(c) developing the activated acid sensitive material.

In an alternative embodiment of the present invention, a photoresist is deposited on top of the acid sensitive material after step (a). When such an embodiment is employed, some areas of the photoresist located on top of the acid sensitive material are exposed and developed while other areas of the photoresist are left undeveloped and thus remain on top of the acid sensitive material. The structure provided is then subjected to steps (b) and (c) above whereby step (c) further includes a step of stripping the previously undeveloped photoresist.

It is noted'that in the above embodiment wherein a photoresist is employed, the thickness of the photoresist is sufficient to block acid diffusion thereby not activating the acid sensitive material. The term "activating" is used herein to denote that the acid source substantially changes the acid sensitive material from an insoluble material to a material which is soluble in common developer solutions. If the thickness of the photoresist is too thin, recessing will occur through the structure but to varying depths.

In another alternative embodiment of the present invention, a resist—resist barrier layer is employed between the photoresist and the acid sensitive material to eliminate problems with poisoning and intermixing. When such a barrier is employed the method of the present invention comprises the steps of:

(a) filling a recessed area of a semiconductor structure containing a conformal layer therein with an acid sensitive material, wherein said acid sensitive material is not photosensitive to light in step (d) below;
(b) applying a resist—resist barrier layer on top of said acid sensitive material;
(c) depositing a photoresist on top of said resist—resist barrier layer;
(d) exposing and developing some areas of said photoresist while leaving other areas of said photoresist undeveloped and thus on top of said resist—resist barrier layer;
(e) subjecting the structure provided by step (d) to an acid source which is capable of selectively activating some of the acid sensitive material; and (f) stripping the remaining photoresist, etching the resist—resist barrier layer, and developing the activated acid sensitive material.

DETAILED DESCRIPTION OF THE INVENTION

Figure 1:
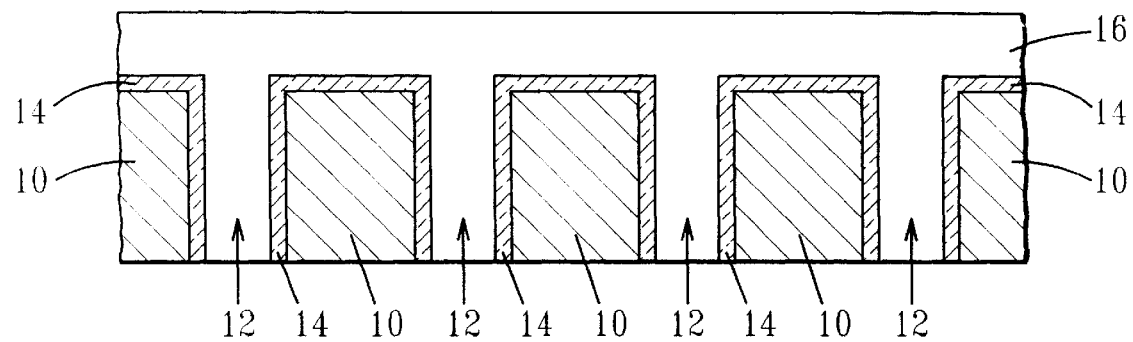
FIG. 1. shows a cross-sectional view of a DRAM trench capacitor structure that can be used in the process of the present invention after filling with an acid sensitive material.

The present invention will now be described in detail with reference to the accompanying drawings, wherein like reference numerals are used for like and corresponding elements of the drawings. It should be noted that although the drawings of the present invention and the description that follows are directed to DRAM trench capacitor structures, the present invention is not limited thereto. Instead, the present invention is applicable for all semiconductor structures which contain a recessed area such as a trench, groove, via or hole therein Reference is made first to FIG. 1 which shows a cross-sectional view of a DRAM trench capacitor structure that can be used in the present invention. Specifically, the structure of FIG. 1 comprises a semiconductor material 10 having at least one trench 12 formed in semiconductor material 10. This structure is fabricated using any conventional technique known in the art to provide trenches in the semiconductor material. This includes, the steps of providing a semiconductor material; applying a photoresist mask to said semiconductor material; patterning the structure by utilizing standard lithographic techniques; and removing the photoresist mask from the structure.

Any suitable material that is semiconducting may be employed in the present invention as semiconductor material 10. This includes, but is not limited to: Si, Ge, GaAs, GaP, InAs and InP. Of these semiconducting materials, it is highly preferred in the present invention that the semiconductor material be composed of Si.

The structure of FIG. 1 further comprises a conformal layer 14 that is formed on the surface of semiconductor material 10 and on the side walls and the bottom of trenches 12 (bottom coverage is not shown in the drawings). Suitable materials that can be employed in the present invention, as conformal layer 14, include: arsenic doped glass (ASG), boron doped glass (BSG), phosphorus doped glass and tetraethylorthosilicate (TEOS). Of these materials, it is highly preferred that conformal layer 14 be composed of ASG.

The structure of FIG. 1 also contains an acid sensitive material 16 which is located within the trenches as well as on the top surface of the structure. Specifically, trenches 12 are filled with an acid sensitive material using standard deposition techniques which include but are not limited to: spin-on coating, chemical vapor deposition, plasma vapor deposition, plasma-enhanced vapor deposition and other like deposition techniques. The conditions of the deposition technique vary depending on the exact technique employed, however, they must be capable of filling the trenches and providing a layer which covers conformal layer 14 found outside trenches 12.

Suitable acid sensitive materials that can be employed in the present invention include, but are not limited to: poly (2-isoprenyl-2-oxazoline) resin crosslinked with di-carboxylic acids (such as 2,2'-(p-phenyl) (bis-1,3-dioxane-5-yl carbonic acid), 2,2'-(4,4'-biphenyl)(bis-1,3-dioxanyl-5-carbonic acid), and 2,2'-(1,5-pentanyl)(bis-1,3-dioxanyl-5-carbonic acid)) to create acetal linkages within the resin. Also, films composed of poly(acrylic acid) crosslinked with a vinyl ether material, such as tetra (ethyleneglycol)divinyl ether, to create a film with ester linkages that are labile to acids may be employed in the present invention.

The acetal and the ester are formed from the reagents during a post apply bake process, after the materials are spin-cast onto a substrate. These resins, being crosslinked and relatively hydrophilic, can be spincast directly underneath an imaging photoresist without a barrier layer to separate the two films. (See, for example, "Design of a Positive Tone Water Soluble Resist," J. M. Havard, J. M. J. Frechet, D. Pasini, B. Mar, C. G. Willson, D. Medeiros, S. Yamada, SPIE vol. 3049, p. 437–447 (1997).)

Other types of acid sensitive materials that could be employed in the present invention are many of the commercially available chemically amplified resist resins. When used in this application, the chemically amplified resists would be formulated without the photo-acid generator, since the acid source will be provided directly, after patterning of the surface resist layer. These resins are, typically, polyhydroxy-styrene copolymers modified with solubility inhibitors such as tertiary-butoxy-carbonyl(t-boc); acetals formed from methoxypropene, tetrahydropyran, or methoxycyclohexene; tertiary-butyl esters; and silyl ethers. Novolak or other similar resins could also be used as the acid sensitive material. Some of the aforementioned polyhydroxy-styrene resins are formed as terpolymers with other monomer species such as methacrylates. These materials are generally soluble in commonly used photoresist solvents, and will mix with the photoresist imaging layer unless a resist—resist barrier layer is incorporated between the acid sensitive film and the photoresist.

Suitable resist—resist barrier layers for this purpose are spun-on-glass (SOG), CVD silicon oxide, silicon nitride, or other similar materials deposited at temperatures below the decomposition point of the acid sensitive resin (generally 115° C. for tertiary-butoxy-carbonyl and acetal materials, 160° C. for tertiary-butyl ester materials), or CVD organic materials (deposited by direct-liquid-injection methods, for example) such as Teflon AF.

Exposure of these resins 16 to strong acid induces a cascade of subsequent chemical transformations of the polymer resins that alter the solubility of the transformed regions.

A photoresist 18 is then optionally deposited on the surface of acid-sensitive material 16 using conventional deposition techniques well known to those skilled in the art. This includes the various deposition techniques mentioned above for filling the trenches with acid-sensitive material 16. The final thickness of the deposited photoresist may vary depending only upon the desired fabricated structure. For example, if recessing is desired in some parts of the structure, but not in others, the thickness of the photoresist should be sufficient so as to prevent diffusion of the acid source to the acid sensitive material.

In general, the rate of diffusion of acid in the photoresist will be similar to the rate of diffusion of acid in the underlayer (as they are both composed of similar resist resins and solubility inhibitors). Thus, the thickness of the photoresist will be chosen to be about 20–50% thicker than the desired depth of acid diffusion into the underlayer, to ensure that the photoresist acts as an effective barrier to the diffusing acid. Some photoresist materials may have higher or lower acid diffusion rates, and the thicknesses will have to be modified accordingly, as is generally known to those skilled in the art.

If the desired structure is to contain recessed trenches of varying depths, the thickness of the photoresist should be of a corresponding thickness so as to allow the acid source to diffuse to the desired depth. In this case, the thickness of the photoresist would generally be less than the desired diffusion depth in the acid sensitive layer in those portions fully exposed to the acid source (where the openings have been lithographically defined in the photoresist layer). This would allow the acid to diffuse through the photoresist and partially into the acid sensitive layer across the entire substrate, but to a greater. depth in those portions where the photoresist has been removed through the lithographic process.

Any photoresist may be employed in the present invention, including those which respond to actinic radiation of G-line, I-line, DUV, 193 nm, E-Beam, X-rays, or other types of actinic radiation. Such photoresists are well known to those skilled in the art, and may include those which are chemically amplified. Positive tone or negative tone resists may be used. In embodiments where it is desirable to remove the resist layer from the substrate prior to further processing, it may be desirable to use a positive tone resist, as this can be easily removed by means of blanket expose and develop, without altering the pattern which has been created in the acid sensitive material.

After formation of photoresist 18, the resist is image-wise exposed to actinic radiation and then photoresist layer 18 is developed using standard techniques well known to those skilled in the art. A structure such as shown in FIG. 3 containing undeveloped regions of photoresist 18 may be provided.

Figure 3:
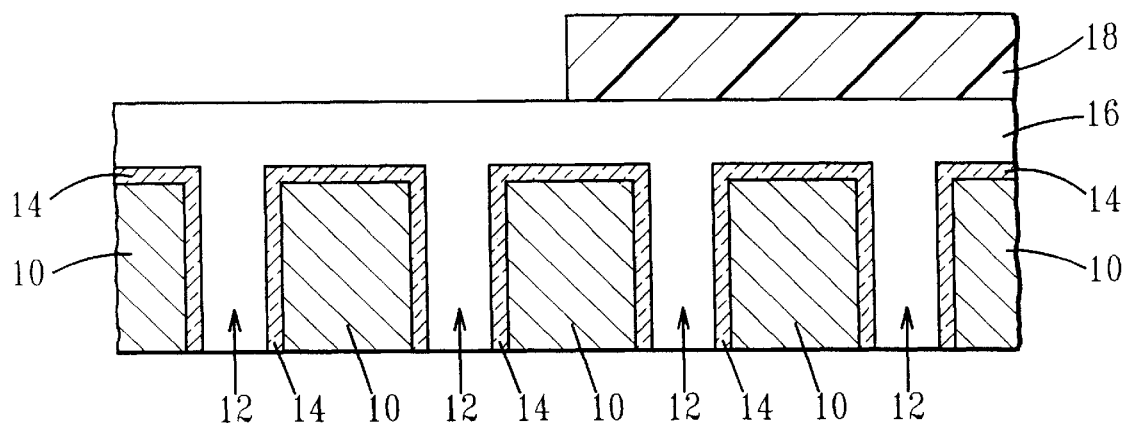
FIG. 3 shows a cross-sectional view of the DRAM trench capacitor structure of FIG. 2 after exposure and develop of the photoresist.

After exposing and developing the structure shown in FIG. 3, it is then subjected to an acid source that is capable of forming hydrogen ions that can diffuse through the acid sensitive material to a desired depth. As stated above, the acid source employed must be capable of generating hydrogen ions which can diffuse through the acid sensitive material. Moreover, the acid source, i.e. hydrogen ions, must be capable of activating the acid sensitive material that it contacts. By activating the acid sensitive material, it becomes soluble in a develop step, such as an aqueous base solution of TMAH, or, in some cases where a water soluble resin is used, a water rinse, that will form the desired recessed shape in the acid sensitive material on the substrate.

Suitable acid sources that can be employed in the present invention are inorganic acids including, but not limited to: HF, triflic acid, perfluoro-n-butyl sulfonic acid, toslic acid, sulfuric acid, trifluoroacetic acid, camphorsulfonic acid, nitric acid, phosphoric acid, hexafluoro-antimonic acid and hexafluoroarsenic acid.

The acid source may be contacted with the acid sensitive material by several means, including: gaseous vapors (for those acids which are volatile, such as HF and trifluoroacetic); as a solution, such as aqueous solutions of the acid, at concentrations ranging from 0.01 N to 5 N, depending on the acid type and the reactivity of the acid sensitive layer; solid state, as by spin-casting a resin matrix (such as polyvinyl alcohol) containing the acid as a component, typically 0.1–10% by weight of acid. Spin-casting is appropriate for non-volatile acids such as camphorsulfonic acid, hexafluoroantimonic acid, perfluoro-n-butylsulfonic acid, and others, as known to those who are skilled in the art. The matrix resin and casting solvent must be chosen so as not to intermix with or otherwise degrade the photoresist pattern. Water casting solutions are generally desirable as they usually do not intermix with the resist or the acid sensitive material.

The acid diffusion step is normally carried out at a temperature of from about 25° C. to 150° C. for a time period of from about 1 minute to 60 minutes. More preferably, the acid diffusion step is carried out at a temperature of from about 25° C. to about 50° C. and for a time period of from about 1 minute to 5 minutes. Due to the nature of the diffusion step, which is well controlled, the uniformity of the material removed will also be well controlled.

After the diffusion is complete, it may be desirable to bake the substrate in order to cause the chemical reaction between the acid sensitive material and the acid to occur. This is particularly preferable for acid-sensitive functionalities which have a higher activation energy in their reaction with acid. The tertiary-butoxy-carbonate and tertiary-butoxy ester functionalities are examples of such high activation. energy materials. The acetal, ketal, and silyl ether functionalities are generally low activation energy materials, and this bake process after diffusion is generally not required. If a bake step is used, it is generally at temperatures of from about 70° to about 150° C. for periods of from about 1 to about 5 minutes.

Figure 4:
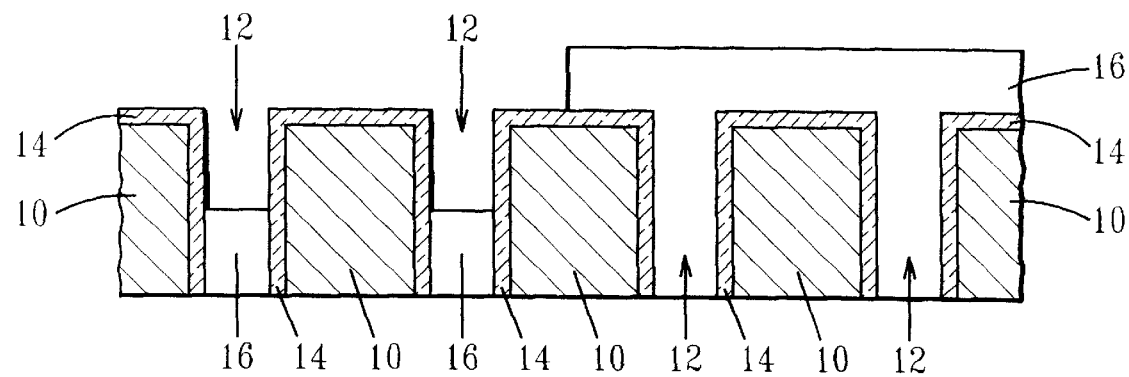
FIG. 4 shows a cross-sectional view of the DRAM capacitor structure of FIG. 3 after acid diffusion and develop step.

After subjecting the structure to an acid source, and, if necessary, baking the substrate, the acid-sensitive material is developed, resulting in either recessing on one part of the wafer and no recessing on the other part of the wafer or recessing in all areas of the wafer to varying depths. The structure that is recessed in only a portion of the wafer is shown in FIG. 4.

In accordance with the present invention, any remaining photoresist 18 may be removed by performing a blanket expose with actinic radiation and developing the resist in standard resist developer. If it is desired to remove the photoresist at this point in the process, it is preferable to have used a positive tone resist. Negative tone resists are often cross-linked upon the image-wise expose step. and removal requires the use of a oxygen plasma or similar method, which will degrade the acid sensitive film as well.

Figure 2:
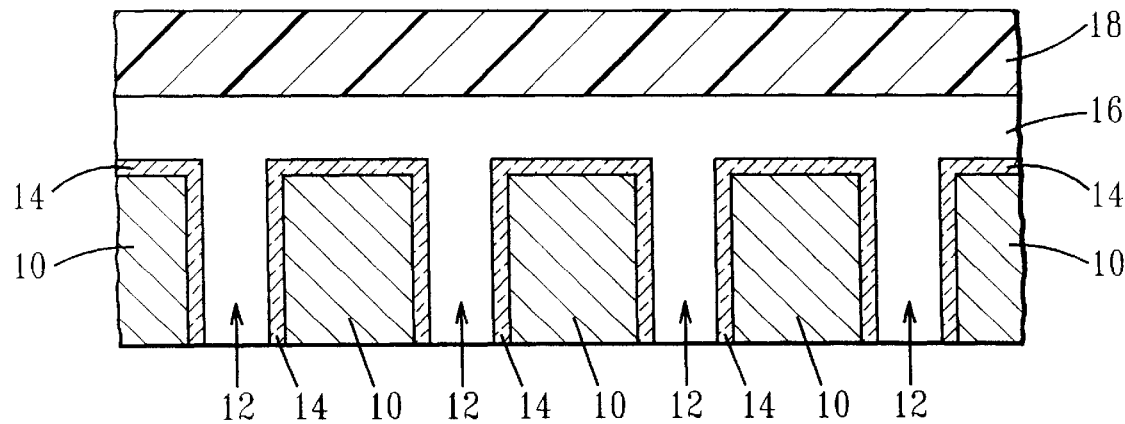
FIG. 2 shows a cross-sectional view of the DRAM trench capacitor structure of FIG. 1 after depositing an optional photoresist on said acid sensitive material.
Figure 5:
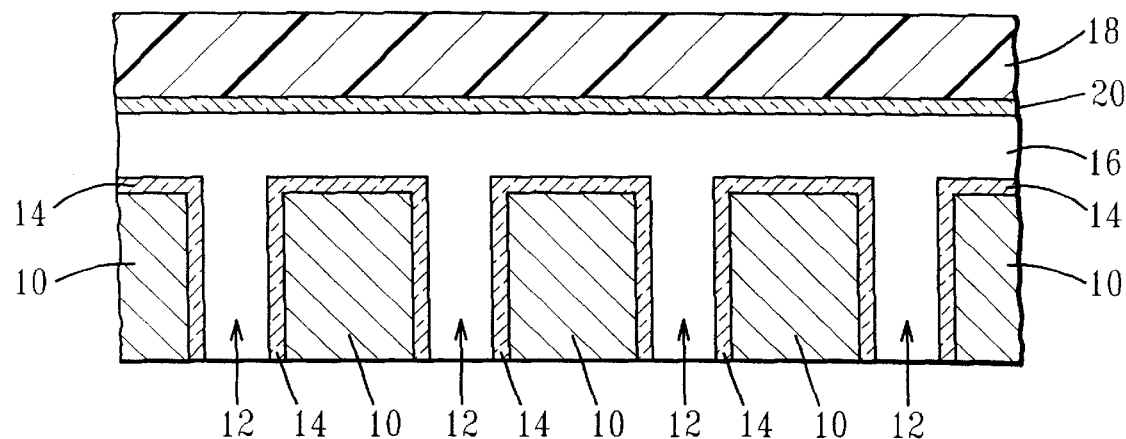
FIG. 5 shows a cross-sectional view of an alternative embodiment of the present invention wherein a resist—resist barrier layer is employed.

An alternative embodiment of the present invention is shown in FIG. 5. Specifically, the structure shown in FIG. 5 is nearly identical to the structure shown in FIG. 2 except that a resist—resist barrier layer 20 is formed between photoresist 18 and acid sensitive material 16 using conventional deposition techniques well known to those skilled in the art. Suitable resist—resist barrier layers that can be employed in the present invention include spun-on glass; low temperature CVD silicon oxide, nitride or similar material; or direct-liquid-injection organic CVD layers such as Teflon AF.

When a resist—resist barrier layer is employed, the process steps are identical to those mentioned hereinabove, except that the barrier layer is etched by chemical etching or dry etching (RIE) prior to exposure of the acid sensitive material to the acid source. The barrier layer inhibits intermixing of the acid sensitive layer with the photoresist layer and with selective removal of the photoresist film selective to the acid-sensitive film.

It is again emphasized that the present invention is not limited to just DRAM trench capacitors. Instead, it is applicable to any semiconductor structure which contains at least one recessed area therein. The recessed area can be a trench, groove or hole that is formed using conventional processes well known to those skilled in the art.

While the invention has been particularly shown and described with respect to preferred embodiments thereof, it will be understood by those skilled in the art that the foregoing and other changes in form and details may be made without departing from the scope and spirit of the present invention. It is therefore intended that the present invention not be limited to the exact forms described and illustrated, but fall within the scope of the appended claims.

Having thus described our invention, what we claim as new, and desire to secure Letters Patent is:

1. A method for selectively recessing material within a previously recessed area of a semiconductor structure comprising the steps of:

(a) filling a recessed area of a semiconductor structure containing a conformal layer with an acid sensitive material, said conformal layer is selected from the group consisting of arsenic doped glass (ASG), boron doped glass (BSG), phosphorus doped glass (PSG) and tetraethylortosilicate;

(b) applying and diffusing an acid source through said acid sensitive material so as to selectively activate said acid sensitive material, wherein said acid source is a liquid, gas or solid that is capable of generating hydrogen ions; and (c) developing the activated acid sensitive material.

2. The method of claim 1 wherein, prior to step (b), a photoresist is deposited on top of said acid sensitive material and some areas of said photoresist are exposed and developed while other areas of said photoresist on top of the acid sensitive material are left undeveloped.

3. The method of claim 2 wherein said undeveloped photoresist is stripped prior to step (c).

4. The method of claim 2 wherein, prior to depositing said photoresist, a resist—resist barrier layer is formed on said acid sensitive material.

5. The method of claim 4 wherein, prior to developing the acid sensitive material, the resist—resist barrier layer is removed by dry etching or chemical etching.

6. The method of claim 4 wherein said resist—resist barrier layer is spun-on-glass; CVD silicon oxide; CVD silicon nitride or Telfon AF.

7. The method of claim 2 wherein said photoresist is a photoresist responsive to actinic radiation.

8. The method of claim 7 wherein said photoresist is a chemically amplified positive tone or negative tone photoresist.

9. The method of claim 2 wherein said photoresist is deposited to a thickness which prevents said acid source from diffusing therein.

10. The method of claim 2 wherein said photoresist is deposited to provide a resist layer of varying thickness.

11. The method of claim 2 wherein said exposure step comprises the use of actinic radiation.

12. The method of claim 2 wherein said developing step comprises the use of a developer solution.

13. The method of claim 1 wherein said conformal layer is ASG.

14. The method of claim 1 wherein said acid sensitive material is a material which becomes soluble when exposed to an acid source and is not photosensitive to actinic radiation in any subsequent exposure step.

15. The method of claim 14 wherein said acid sensitive material is a poly(2-isoprenyl-2-oxazoline resin crosslinked with a di-carboxylic acid; a poly(acrylic acid) crosslinked with a vinyl ether; a polyhydroxy-styrene copolymer modified with a solubility inhibitor or a Novolak resin.

16. The method of claim 1 wherein said acid source comprises an inorganic acid selected from the group consisting of HF, triflic acid, perfluoro-n-butyl sulfonic acid, toslic acid, sulfuric acid, trifluoroacetic acid, camphorsulfonic acid, nitric acid, phosphoric acid, hexafluoroantimonic acid and hexafluoroarsenic acid.

17. The method of claim 1 wherein step (b) is carried out at a temperature of from about 25° to about 150° C. for a time period of from about 1 to about 60 minutes.

18. The method of claim 17 wherein step (b) is carried out at a temperature of from about 25° to about 50° C. for a time period of from about 1 to about 5 minutes.

19. The method of claim 1 wherein, prior to step (c), the structure is baked in order to cause substantial chemical reaction between the acid sensitive material and the acid source.

20. The method of claim 19 wherein said bake step is conducted at a temperature of from about 70° to about 150° C. for a time period of from 1 to about 5 minutes.

21. The method of claim 1 wherein said semiconductor structure is a DRAM chip having a trench as said recessed area.

* * * * *